(12) United States Patent
Nakayama et al.

(10) Patent No.: US 9,766,539 B2
(45) Date of Patent: Sep. 19, 2017

(54) METHOD FOR DETERMINING MASK PATTERN, NON-TRANSITORY RECORDING MEDIUM, AND INFORMATION PROCESSING APPARATUS

(71) Applicant: CANON KABUSHIKI KAISHA, Tokyo (JP)

(72) Inventors: Ryo Nakayama, Utsunomiya (JP); Yuichi Gyoda, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 641 days.

(21) Appl. No.: 14/184,611

(22) Filed: Feb. 19, 2014

(65) Prior Publication Data

US 2014/0244215 A1  Aug. 28, 2014

(30) Foreign Application Priority Data

Feb. 22, 2013 (JP) ................. 2013-033509

(51) Int. Cl.
*G03F 1/70* (2012.01)
*G03F 7/20* (2006.01)

(52) U.S. Cl.
CPC ............ *G03F 1/70* (2013.01); *G03F 7/70433* (2013.01); *G03F 7/70466* (2013.01)

(58) Field of Classification Search
CPC .......... G03F 1/84; G03F 1/70; G03F 7/70125; G03F 7/70133; G03F 7/70216; G06F 17/5081
See application file for complete search history.

(56) References Cited

U.S. PATENT DOCUMENTS

| | | |
|---|---|---|
| 2004/0243356 A1 | 12/2004 | Duffy |
| 2007/0031740 A1 | 2/2007 | Chen et al. |
| 2008/0020326 A1 | 1/2008 | Choi |
| 2008/0319712 A1 | 12/2008 | Claps |
| 2010/0223590 A1 | 9/2010 | Lippincott |
| 2011/0078638 A1 | 3/2011 | Kahng |
| 2011/0197168 A1* | 8/2011 | Chen ................ G06F 17/5081 716/50 |
| 2012/0124529 A1 | 5/2012 | Feng |
| 2014/0075397 A1* | 3/2014 | Agarwal ............ G03F 7/70283 716/52 |

FOREIGN PATENT DOCUMENTS

| | | |
|---|---|---|
| CN | 101008788 A | 8/2007 |
| CN | 101241300 A | 8/2008 |

(Continued)

*Primary Examiner* — Toan Le
(74) *Attorney, Agent, or Firm* — Canon USA, Inc., IP Division

(57) ABSTRACT

A method which determines patterns for a plurality of masks to be executed by a processor includes acquiring data on a pattern containing a plurality of pattern elements, and assigning the acquired plurality of pattern elements into masks, decomposing the acquired plurality of pattern elements into patterns of the masks, and calculating an evaluation value for an evaluation index, based on a number of masks, the distances between a plurality of pattern elements in each mask, and an angle of a line connecting a plurality of pattern elements in each mask. In the method, a pattern of each mask is determined based on the calculated evaluation value.

13 Claims, 8 Drawing Sheets

(56) References Cited

FOREIGN PATENT DOCUMENTS

| | | |
|---|---:|---:|
| CN | 1012147821 | 8/2011 |
| EP | 1804123 A2 | 7/2007 |
| EP | 1901121 A2 | 3/2008 |
| JP | 2002-083761 A | 3/2002 |
| JP | 2008-261922 A | 10/2008 |
| KR | 10-2008-0008796 A | 1/2008 |
| TW | 359770 B | 6/1999 |
| TW | 200915462 A | 4/2009 |

* cited by examiner

FIG. 4A
FIG. 4B
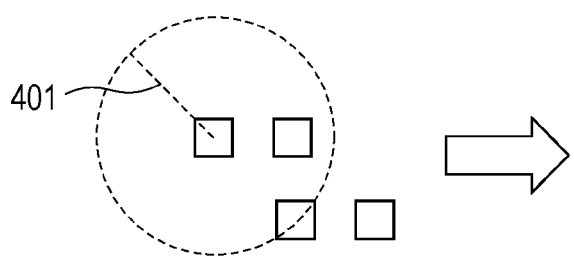
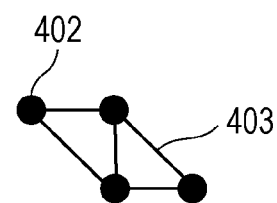
FIG. 5
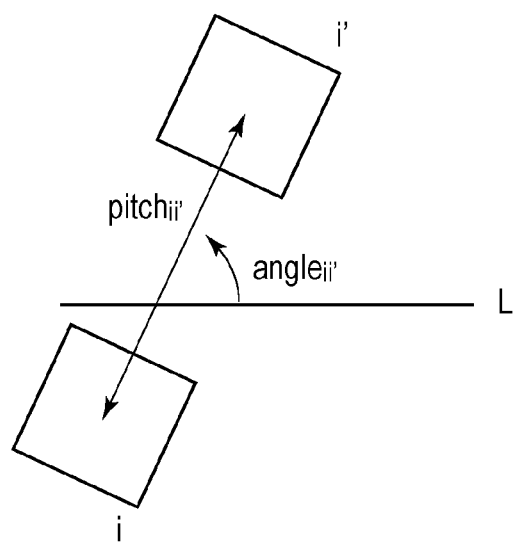

MASK 1  MASK 2

MASK 1  MASK 2

METHOD FOR DETERMINING MASK PATTERN, NON-TRANSITORY RECORDING MEDIUM, AND INFORMATION PROCESSING APPARATUS

BACKGROUND OF THE INVENTION

Field of the Invention

The present invention relates to a method for determining a mask pattern, a recording medium, and an information processing apparatus.

Description of the Related Art

In recent years, with the advance of miniaturization of semiconductor devices, it has been difficult to transfer a desired pattern onto a wafer with high accuracy by using an exposure apparatus. One cause of this may be a reduced half pitch that is the half of a shortest distance between patterns included in a circuit.

In order to address this problem, multiple-exposure patterning has been gathering attention as a technology for transferring a minute pattern such as 22 nm node onto a wafer with high accuracy. This technology is used to divide a pattern having a half pitch smaller than the half pitch of a resolution limit of an exposure apparatus into a plurality of mask patterns and expose them for transfer of a minute pattern with higher accuracy than in a case where the pattern is exposed once as in the past.

Multiple exposure patterning may require determination of a plurality of lithography-friendly mask patterns with which resolving performance such as a depth of focus may be improved and a yield may be improved. A method for determining such a plurality of mask patterns is disclosed in United States Patent Application Publication No. 2007/31740, Description, and United States Patent Application Publication No. 2010/223590, Description.

United States Patent Application Publication No. 2007/31740, Description, discloses a method in which a decomposition rule is applied to a pattern based on an iterative method. More specifically, the method includes determining first a pattern decomposition rule, determining whether a target pattern element belongs to a first mask or a second mask based on the rule, and repeating the operation for each pattern element. According to the decomposition rule, a pattern is decomposed in accordance with a result of determination on whether it is critical or not based on a line width of a pattern or a distance between patterns.

United States Patent Application Publication No. 2010/223590, Description, discloses a method for determining a plurality of mask patterns for performing exposure twice by assuming that two types of dipole illumination for a light intensity distribution (effective light source distribution) are formed on a pupil plane of an illumination optical system that illuminates a mask. More specifically, this method includes analyzing which illumination of x- and y-direction dipole illuminations is suitable for transferring a pattern to be decomposed and determining two types of mask pattern. A pattern having longitudinal edges extending in the y-direction is determined as a mask pattern for an x-direction dipole illumination while a pattern having longitudinal edges extending in the x-direction is determined as a mask pattern for a y-direction dipole illumination. In United States Patent Application Publication No. 2007/31740, Description, each mask pattern is determined in consideration of a line width of a pattern or a distance between patterns but not in consideration of angles between a plurality of pattern elements. This results in a plurality of pattern elements having different angles included in one mask. When the mask is illuminated by one effective light source distribution, the ease of resolution of the pattern elements may vary, and some pattern elements may have difficulty in being resolved.

According to United States Patent Application Publication No. 2010/223590, Description, mask patterns are divided by associating directions of edges of pattern elements and directions of dipole illuminations. However, relative positional relationships among a plurality of pattern elements, that is, the distances or angles between a plurality of pattern elements are not taken into consideration. This results in presence of a plurality of pattern elements having different relative positional relationships in one mask. When the mask is illuminated by one effective light source distribution, the ease of resolution of the pattern elements may vary, and some pattern elements may have difficulty in being resolved.

SUMMARY OF THE INVENTION

An embodiment of the present invention determines a mask pattern that is easy to be resolved when a pattern is decomposed into a plurality of mask patterns.

According to an aspect of the present invention, there is provided a method for determining a mask pattern which determines patterns for a plurality of masks, the method being executed by a processor, including acquiring data on a pattern containing a plurality of pattern elements, and assigning the acquired plurality of pattern elements into masks, decomposing the acquired plurality of pattern elements into patterns of the masks, and calculating an evaluation value for an evaluation index, based on a number of masks, the distances between a plurality of pattern elements in each mask, and angles of lines connecting a plurality of pattern elements in each mask, in which a pattern of each mask is determined based on the calculated evaluation value.

Further features of the present invention will become apparent from the following description of exemplary embodiments with reference to the attached drawings.

BRIEF DESCRIPTION OF THE DRAWINGS

FIGS. 4A and 4B are diagrams for explaining a conflict graph.

FIG. 5 illustrates a distance and angle between pattern elements.

DESCRIPTION OF THE EMBODIMENTS

An embodiment relates to a lithography technology usable for producing a device such as a semiconductor integrated circuit, a liquid crystal panel, an LED, and an image sensor, and in particular it may possibly be used in processes of forming a pattern of a mask for multiple exposure such as double exposure and determining an exposure illumination condition.

Figure 1:
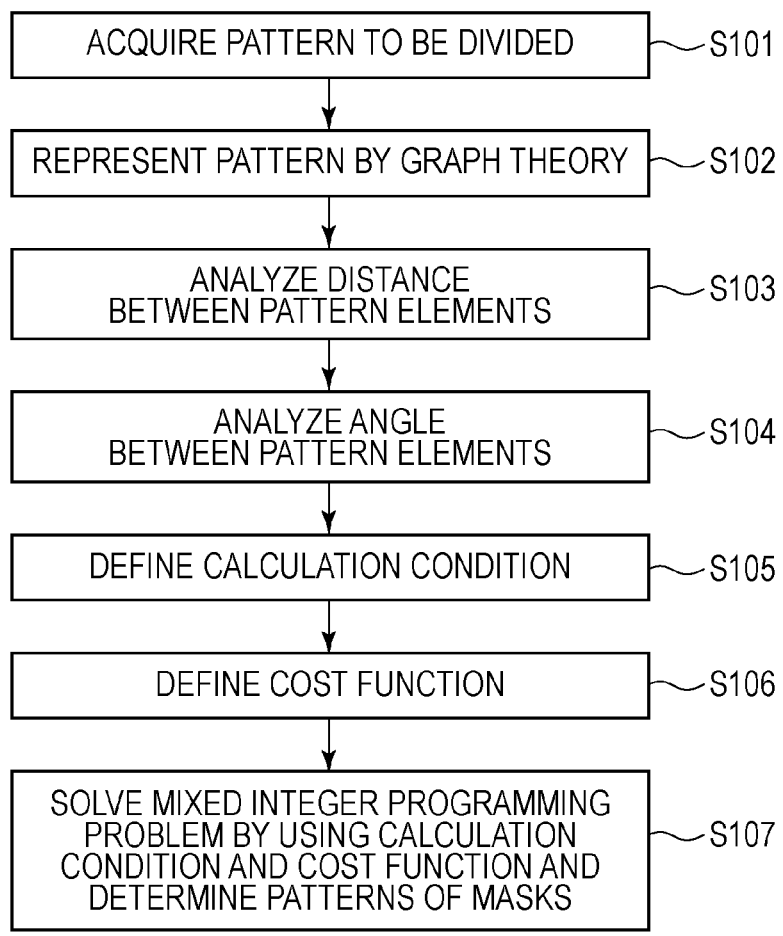
FIG. 1 is a flowchart illustrating a method for determining a mask pattern.

FIG. 1 is a flowchart illustrating a method for determining a mask pattern (hereinafter also referred to as a pattern determination method). This method is implemented by reading and executing a program by a processing unit (such as a CPU or an MPU) in a computer. Software or a program that implements a function of this embodiment is supplied to an information processing apparatus including one or more computers over a network or through a recording medium. A processing unit in the information processing apparatus reads a program recorded or stored in a recording medium or a storage medium to execute the program. A plurality of computers provided at remote positions may exchange data mutually through wired or wireless communication to perform a process of a program.

Figure 2A:
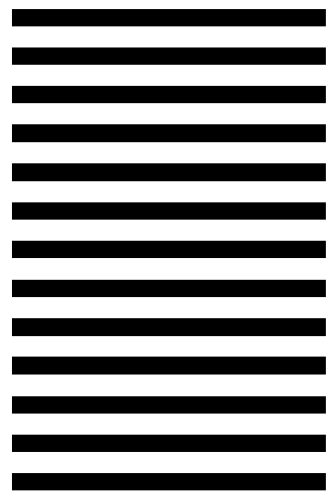
FIGS. 2A to 2C are diagrams for explaining a one-dimensional layout technology.
Figure 2B:
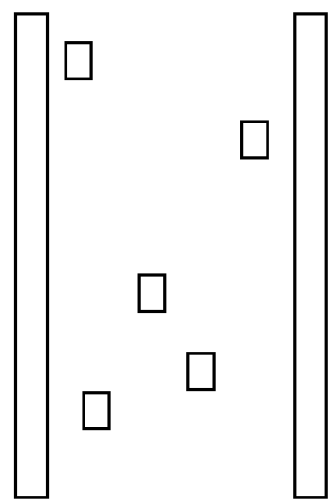
Figure 2C:
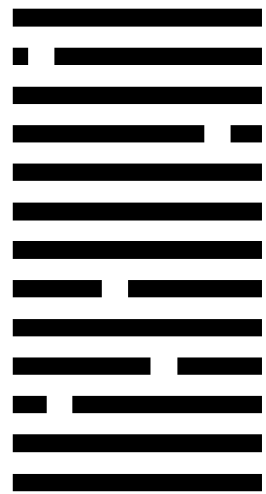
Figure 3:
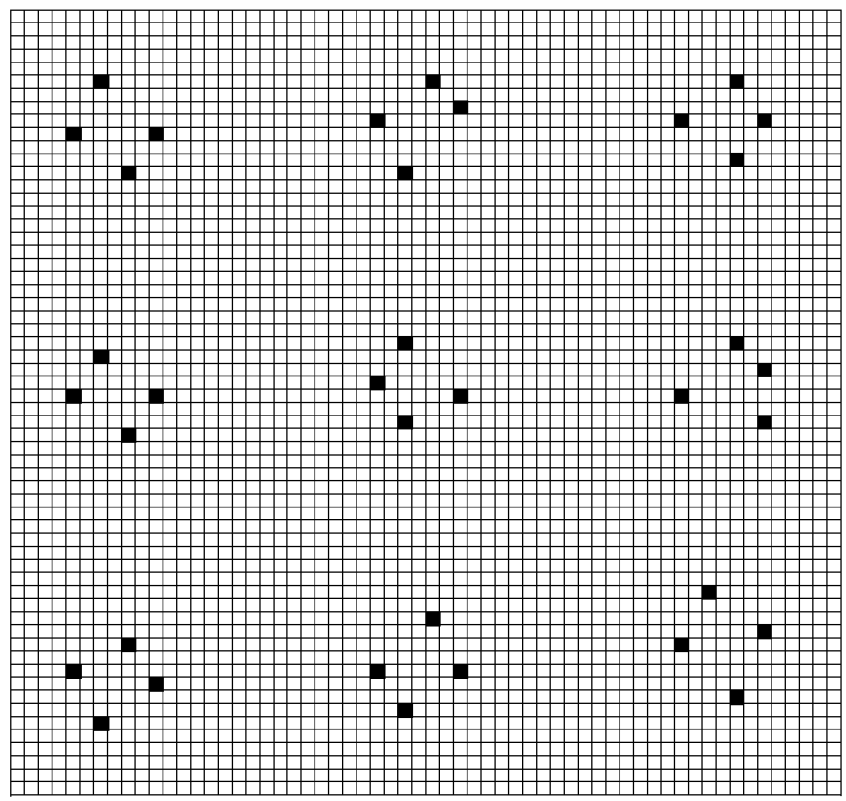
FIG. 3 is a diagram for explaining a cut pattern to be decomposed.

First, in step S101, a processing unit in a computer acquires data on a pattern to be decomposed. The data may be input from a data input device or may be input from an external computer or a recording medium. The data may be stored in a storage unit in the computer or may be read and acquired from the storage unit for every use. In this embodiment, a cut pattern according to one-dimensional layout technology is applied as an example of a pattern to be decomposed. FIG. 2A illustrates a line and space pattern formed on a wafer. The term "one-dimensional layout technology" refers to a technology of processing a line pattern part (black part) of a line and space pattern illustrated in FIG. 2A by cutting it by using a hole pattern and upper and lower lines within black frames in FIG. 2B to acquire a target pattern as in FIG. 2C. The term "cut pattern" refers to a hole pattern as represented by the five black frames in FIG. 2B hereinafter. A technology of processing a space part of a line and space pattern by filling with a dot pattern is also included in the one-dimensional layout technology. According to this embodiment, the cut pattern illustrated in FIG. 3 is used as a pattern to be decomposed. Each part colored with black in FIG. 3 corresponds to a pattern element of a cut pattern and is a square of side 23 nm. The pattern to be decomposed may be provided as a polygon coordinate array, for example.

Next, in step S102, the pattern is expressed by a conflict graph by using a graph theory under a constraint condition. For example, a predetermined distance 401 illustrated in FIG. 4A is defined. If the distance between center positions of pattern elements is equal to or shorter than the predetermined distance, it means that there is a constraint condition that the mask pattern should be mutually different. Each of the black frames of squares in FIG. 4A represents a pattern element, and the broken line represents a circle having a center position of a pattern element as its center and having the distance 401 as its radius. The condition is specifically represented by a conflict graph as illustrated in FIG. 4B. A pattern element is represented by a point (vertex) 402, and pattern elements having a distance equal to or shorter than the predetermined distance are connected by a segment (edge) 403. Both ends connected by the segment 403 should be colored by different mask numbers (color). A problem of determining the number of masks (the number of decomposition levels) and a pattern for each mask may also be called a coloring problem because it is characterized in that pattern elements are colored with different colors. Hereinafter, a mask number may be defined as a color number, and a process of determining the number of masks and a pattern of each mask may be described by using a representation of different coloring.

Next, in step S103, a distance between pattern elements included in the pattern acquired in step S102 is analyzed and acquired. In step S104, the angle of the line connecting pattern elements included in the pattern acquired in step S102 is analyzed and acquired.

In step S105, calculation conditions such as constraint conditions and boundary conditions and variables are formulated and defined as a mixed integer programming problem. In step S106, cost functions are defined as a mixed integer programming problem. The constraint conditions, boundary conditions, variables, and cost functions will be described in detail below. Next, in step S107, those conditions, variables, and cost functions are used to solve the mixed integer programming problem, and the plurality of pattern elements are assigned to masks. The plurality of pattern elements are colored differently to determine the patterns of the masks. The data on the determined patterns of the masks are output as solutions and may sometimes be displayed on a monitor. For example, ILOG CPLEX (registered trademark), IBM, may be used as software for solving the mixed integer programming problem.

The variables, constants, and expressions to be used in a program will be described in detail below.

(1) Description of Variables $j$: a color number, where $1 \leq j \leq m$ $m$: a maximum color number $i'$: pattern element number $P_{all}$ a minimum value of a distance between pattern elements in all colors $P_j$: a minimum value of distances between pattern elements in the jth color $D_{ii'j}$: a binary variable that takes 1 if both of the ith pattern element and the i'th pattern element are colored with the jth color while it takes 0 if they are not colored.

$y_j$: a binary variable that indicates how color j is to be used and takes 1 if it is used or 0 if not.

$x_{ij}$: a binary variable that indicates how color j is to be used in the ith pattern element and takes 1 if it is used or 0 if not.

(2) Description of Constants $pitch_{ii'}$: a distance between the centers of the ith pattern element and the i'th pattern element $angle_{ii'}$: an angle of a line connecting the ith pattern element and the i'th pattern element $\alpha$: a weight of the first term of a cost function indicative of the number of colors $\beta$: a weight of the second term of a cost function indicative of a minimum value of distances between pattern elements in all colors $\gamma$: a weight of the third term of a cost function indicative of a sum of minimum values of distances between pattern elements in each color $\delta$: a weight of the fourth term of a cost function determined by the distance and angle between pattern elements in each color $a$: a weight of a term of a distance between pattern elements in the fourth term $b$: a weight of a term of angles between pattern elements in the fourth term $c$: a weight indicative of a constant in the fourth term FIG. 5 illustrates the $pitch_{ii'}$ and $angle_{ii'}$. The $angle_{ii'}$ represents an angle of a line connecting the ith pattern element and the i'th pattern element about a reference line L.

(3) Description of Expressions
(3.1) Cost Function

The cost function (evaluation index) defined in step S108 will be described in detail. The cost function is expressed by Expression (1). The term "minimize" in Expression (1) indicates that it is a linear programming problem that minimizes the cost function.

$$\text{minimize } \alpha * \sum_{j=1}^{m} y_j + \beta * P_{all} + \gamma * \sum_{j=1}^{m} P_j + \delta * \sum_{j=1}^{m} A_j \quad \text{Expression 1}$$

In this case, $\alpha$ and $\delta$ are positive constants, and $\beta$ and $\gamma$ are both negative constants. Expression (1) is a cost function for the purpose of solving the problem to minimize the number of colors, maximum the minimum value of a distance between pattern elements and minimize the value of the term $A_j$ defined by a distance and angle between pattern elements.

Next, the terms of Expression (1) will be described.

$$\sum_{j=1}^{m} y_j$$

of the first term represents the number of colors, that is, the number of masks. For example, when the number of colors is equal to 2, $$\sum_{j=1}^{m} y_j = 2$$

Each of $P_{all}$ and $P_j$ in the second and third terms represent minimum a distance (nm) between pattern elements. For example, if the minimum distance between decomposed pattern elements decreases by 1 nm, the value decreases by 1.

The $A_j$ in the fourth term, that is, cost representing the term defined by the distance and angle between pattern elements will be described with reference to figures. First, $A_j$ may be expressed by Expression (2) and is a cost representing that the easiness of exposure increases as $A_j$ decreases.

$$A_j = -a * f(\text{pitch}_{ii'}) + b * g(\text{angle}_{ii'} - T_j) + c \quad \text{Expression 2}$$

where a, b, and c are positive constants.

Next, the terms of Expression (2) will be described.

Figure 6A:
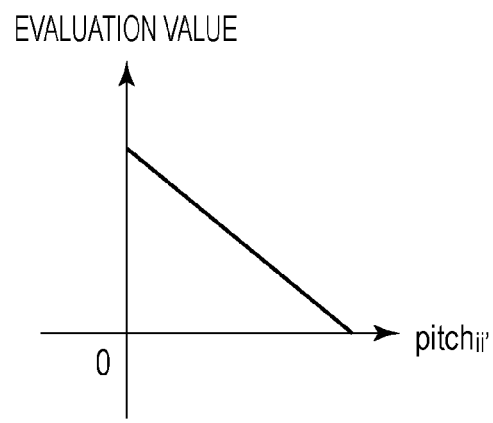
FIG. 6A illustrate an evaluation value with respect to a distance.

The first term is defined in accordance with the distance between pattern elements and is a function of pitch$_{ii'}$. Because the resolving performance (such as depth of focus, process window, and NILS) of a pattern is high (exposure is easier) when a distance between pattern elements is large, the first term is modeled such that it may have an evaluation value that increases as the distance between pattern elements increases. In the Expression, $A_j$ decreases as the distance between pattern elements increases. In this sense, it may be said that the evaluation value represents the difficulty of resolution of a pattern (difficulty of exposure). FIG. 6A illustrates an example of the first term.

Figure 6B:
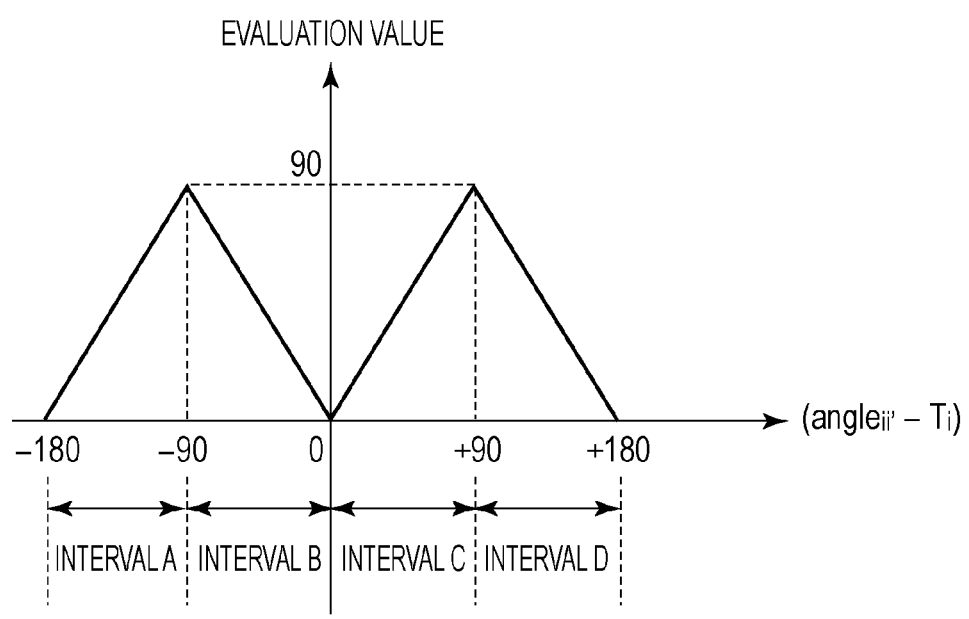
FIG. 6B illustrates an evaluation value with respect to a distance.

The second term is defined in accordance with the angle$_{ii'}$ of the line connecting pattern elements and is represented by a function of the difference between angle$_{ii'}$ and $T_j$. This function is defined such that it takes a minimum value when the absolute value of (angle$_{ii'}-T_j$) is 0 or 180 degrees, increases as it deviates from 0 degrees and approaches 90 degrees, and takes a maximum value when it is 90 degrees. FIG. 6B illustrates an example of the second term.

$T_j$ is a variable that may take an arbitrary value in the range from 0 degrees to 180 degrees and is defined as a constant value for each color j. For example, when $T_1$ is 0 degrees and if the angle between pattern elements is close to 0 degrees, the second term is small, resulting in a good evaluation value. Thus, a pattern having color i=1 is easily generated with pattern elements the angle between which is close to 0 degrees. The effective light source distribution (light intensity distribution formed on a pupil plane of an illumination optical system that illuminates a mask) that improves the resolution of the mask pattern containing such pattern elements and is suitable for illumination is a dipole illumination having two poles disposed in the direction toward the reference line L (angle: 0 degrees). In other words, the value of $T_j$ in the second term represents a polarity of an effective light source distribution suitable for illumination of a mask. If $T_j$ is equal to 90 degrees, a dipole illumination having two poles disposed in the orthogonal direction (angle: 90 degrees) to the reference line L.

Table 1 illustrates examples of the value of $A_j$ against variable distances and angles between pattern elements. The vertical column shows angle (angle$_{ii'}-T_j$), and the horizontal column shows distance between the centers of pattern elements. The value shown on the table are calculated by inputting a=0.3, b=0.1, and c=50 to a, b, and c of Expression (2).

TABLE 1

| | | DISTANCE BETWEEN PATTERN ELEMENTS | | | | | | | | | | | |
|---|---|---|---|---|---|---|---|---|---|---|---|---|---|
| | | 90 | 95 | 100 | 105 | 110 | 115 | 120 | 125 | 130 | 135 | 140 | 145 | 150 |
| ANGLE | 0 | 23.0 | 21.5 | 20.0 | 18.5 | 17.0 | 15.5 | 14.0 | 12.5 | 11.0 | 9.5 | 8.0 | 6.5 | 5.0 |
| | 10 | 24.0 | 22.5 | 21.0 | 19.5 | 18.0 | 16.5 | 15.0 | 13.5 | 12.0 | 10.5 | 9.0 | 7.5 | 6.0 |
| | 20 | 25.0 | 23.5 | 22.0 | 20.5 | 19.0 | 17.5 | 16.0 | 14.5 | 13.0 | 11.5 | 10.0 | 8.5 | 7.0 |
| | 30 | 26.0 | 24.5 | 23.0 | 21.5 | 20.0 | 18.5 | 17.0 | 15.5 | 14.0 | 12.5 | 11.0 | 9.5 | 8.0 |
| | 40 | 27.0 | 25.5 | 24.0 | 22.5 | 21.0 | 19.5 | 18.0 | 16.5 | 15.0 | 13.5 | 12.0 | 10.5 | 9.0 |
| | 50 | 28.0 | 26.5 | 25.0 | 23.5 | 22.0 | 20.5 | 19.0 | 17.5 | 16.0 | 14.5 | 13.0 | 11.5 | 10.0 |
| | 60 | 29.0 | 27.5 | 26.0 | 24.5 | 23.0 | 21.5 | 20.0 | 18.5 | 17.0 | 15.5 | 14.0 | 12.5 | 11.0 |
| | 70 | 30.0 | 28.5 | 27.0 | 25.5 | 24.0 | 22.5 | 21.0 | 19.5 | 18.0 | 16.5 | 15.0 | 13.5 | 12.0 |
| | 80 | 31.0 | 29.5 | 28.0 | 26.5 | 25.0 | 23.5 | 22.0 | 20.5 | 19.0 | 17.5 | 16.0 | 14.5 | 13.0 |
| | 90 | 32.0 | 30.5 | 29.0 | 27.5 | 26.0 | 24.5 | 23.0 | 21.5 | 20.0 | 18.5 | 17.0 | 15.5 | 14.0 |
| | 100 | 31.0 | 29.5 | 28.0 | 26.5 | 25.0 | 23.5 | 22.0 | 20.5 | 19.0 | 17.5 | 16.0 | 14.5 | 13.0 |
| | 110 | 30.0 | 28.5 | 27.0 | 25.5 | 24.0 | 22.5 | 21.0 | 19.5 | 18.0 | 16.5 | 15.0 | 13.5 | 12.0 |
| | 120 | 29.0 | 27.5 | 26.0 | 24.5 | 23.0 | 21.5 | 20.0 | 18.5 | 17.0 | 15.5 | 14.0 | 12.5 | 11.0 |
| | 130 | 28.0 | 26.5 | 25.0 | 23.5 | 22.0 | 20.5 | 19.0 | 17.5 | 16.0 | 14.5 | 13.0 | 11.5 | 10.0 |
| | 140 | 27.0 | 25.5 | 24.0 | 22.5 | 21.0 | 19.5 | 18.0 | 16.5 | 15.0 | 13.5 | 12.0 | 10.5 | 9.0 |

TABLE 1-continued

| | DISTANCE BETWEEN PATTERN ELEMENTS | | | | | | | | | | | | |
|---|---|---|---|---|---|---|---|---|---|---|---|---|---|
| | 90 | 95 | 100 | 105 | 110 | 115 | 120 | 125 | 130 | 135 | 140 | 145 | 150 |
| 150 | 26.0 | 24.5 | 23.0 | 21.5 | 20.0 | 18.5 | 17.0 | 15.5 | 14.0 | 12.5 | 11.0 | 9.5 | 8.0 |
| 160 | 25.0 | 23.5 | 22.0 | 20.5 | 19.0 | 17.5 | 16.0 | 14.5 | 13.0 | 11.5 | 10.0 | 8.5 | 7.0 |
| 170 | 24.0 | 22.5 | 21.0 | 19.5 | 18.0 | 16.5 | 15.0 | 13.5 | 12.0 | 10.5 | 9.0 | 7.5 | 6.0 |
| 180 | 23.0 | 21.5 | 20.0 | 18.5 | 17.0 | 15.5 | 14.0 | 12.5 | 11.0 | 9.5 | 8.0 | 6.5 | 5.0 |

The table above shows that the value increases as the angle approaches 90 degrees and the value increases as the distance decreases and the evaluation value for the cost function deteriorates. By determining patterns of masks to minimize the evaluation value for the cost function, a mask pattern may be created that may be resolved with low difficulty and may be exposed easily.

According to this embodiment, $\alpha=1$, $\beta=-0.001$, $\gamma=-0.00001$, and $\delta=0.001$ are input to Expression (1). These values are defined for purpose of mask pattern decomposition in consideration of a lower number of colors by priority, a larger minimum distance between patterns, and a relationship between a distance and angular characteristic between patterns. The weight for $\gamma$ is relatively small. Those values may be replaced by other values in accordance with the term to be prioritized.

The positive and negative signs of the terms may be inverted to maximize the cost function of Expression (1). This is because the solution is not influenced by the minimized cost function, inversion of the positive and negative signs of the terms, and maximized cost function.

(3.2) Constraint Conditions, Boundary Conditions, and Binary Variables

Constraint conditions are expressed by Expression (3) to Expression (20). Boundary conditions are expressed by Expression (21) to Expression (23). Binary variables are expressed by Expression (24) to Expression (27). Constraint Conditions $$y_1 \geq y_2 \geq \ldots \geq y_m \quad \text{Expression 3}$$

$$\sum_{j=1}^{m} x_{ij} = 1 (\forall i) \quad \text{Expression 4}$$

$$x_{ij} \leq y_j (\forall i, \forall j) \quad \text{Expression 5}$$

$$x_{ij} + x_{i'j} \leq 1 (\forall j, \forall i, \forall i' \in A) \quad \text{Expression 6}$$

$$x_{ij} + x_{i'j} \geq 2*D_{ii'j} (\forall j, \forall i, \forall i' \in B) \quad \text{Expression 7}$$

$$x_{ij} + x_{i'j} \leq 1 + D_{ii'j} (\forall j, \forall i, \forall i' \in B) \quad \text{Expression 8}$$

$$P_j - \text{pitch}_{ii'}*D_{ii'j} - 500(1-D_{ii'j}) \leq 0 (\forall j) \quad \text{Expression 9}$$

$$P_j \geq P_{all} (\forall j) \quad \text{Expression 10}$$

$$A_{ii'j} + 500(1-D_{ii'j}) \geq -a*\text{pitch} + b*(B1_{ii'j} - B2_{ii'j} + B3_{ii'j} - B4_{ii'j}) + c (\forall j) \quad \text{Expression 11}$$

$$\text{angle}_{ii'} - T = (B1_{ii'j} + B2_{ii'j} + B3_{ii'j} + B4_{ii'j}) - 180 (\forall j) \quad \text{Expression 12}$$

$$90*Z1_{ii'j} \leq B1_{ii'j} \leq 90 (\forall j) \quad \text{Expression 13}$$

$$90*Z2_{ii'j} \leq B2_{ii'j} \leq 90*Z1_{ii'j} (\forall j) \quad \text{Expression 14}$$

$$90*Z3_{ii'j} \leq B3_{ii'j} \leq 90*Z2_{ii'j} (\forall j) \quad \text{Expression 15}$$

$$0 \leq B4_{ii'j} \leq 90*Z3_{ii'j} (\forall j) \quad \text{Expression 16}$$

$$Z3_{ii'j} \leq Z2_{ii'j} \leq Z1_{ii'j} (\forall j) \quad \text{Expression 17}$$

$$A_j - A_{ii'j} \geq 0 (\forall j) \quad \text{Expression 18}$$

$$A_{ii'j} \geq 0 (\forall j) \quad \text{Expression 19}$$

$$0 \leq T_j \leq 180 (\forall j) \quad \text{Expression 20}$$

Boundary Conditions $$y_1 = 1 \quad \text{Expression 21}$$

$$P_j \geq 0 (\forall j) \quad \text{Expression 22}$$

$$P_{all} \geq 0 \quad \text{Expression 23}$$

Binary Variables $$y_j (\forall j) \quad \text{Expression 24}$$

$$x_{ij} (\forall i, \forall j) \quad \text{Expression 25}$$

$$D_{ii'j} (\forall j) \quad \text{Expression 26}$$

$$Z1_{ii'j}, Z2_{ii'j}, Z3_{ii'j} (\forall j) \quad \text{Expression 27}$$

The constraint conditions expressed by Expression (3) to Expression (20) will be described. Expression (3) expresses a constraint condition that color numbers are used in increasing order. For example, if y1=0 and y2=1, it means that the first color number is not used while the second color number is used. The constraint condition above prevents this. Expression (4) expresses a constraint condition that one color is only used for the ith pattern element. Expression (5) expresses a constraint condition that coloring with an unused color is prohibited. The constraint condition prevents the occurrence of the state that the jth color is used for the ith pattern element, that is, $x_{ij}=1$ while the jth color number is not used, that is, $y_j=0$.

Expression (6) expresses a constraint condition relating to a location of a color number. This constraint condition prevents the state that the ith and i'th pattern elements have the same color number when the ith pattern element and the i'th pattern element are connected by a segment of a conflict graph. This constraint condition is applied when the distance between the centers of the ith and i'th pattern elements connected by a segment of a conflict graph falls within a predetermined range A.

Expression (7) and Expression (8) express constraint conditions for binary variable $D_{ii'j}$. When both of $x_{ij}$ and $x_{i'j}$ are equal to 1, $D_{ii'j}=1$. When at least one of $x_{ij}$ and $x_{i'j}$ is equal to 0, $D_{ii'j}=0$. Therefore, it means that $D_{ii'j}$ is AND of $x_{ij}$ and $x_{i'j}$. These constraint conditions are applied when the distance between the ith and i'th patterns falls within a predetermined range B.

Expression (9) expresses a constraint condition with respect to a distance between pattern elements. When $D_{ii'j}$ is equal to 1, $P_j \leq \text{pitch}_{ii'}$, so that the value of $P_j$ may be equal to or lower than the value of a distance between pattern elements in each color j. When $D_{ii'j}$ is equal to 0, $P_j \leq 500$. In this case, the higher value, 500, is used to prevent $P_j$ from being substantially constrained normally when $D_{ii'j}=0$. The value 500 is used in this embodiment as a sufficiently higher number than the value of a distance between pattern elements. However, the meaning of the numeral expressions does not change even when other values are used as far as it is high. Expression (10) expresses a constraint condition that $P_{all}$ takes a minimum value of a plurality of $P_j$.

Expression (11) is a constraint condition with respect to a distance and angle between pattern elements. Expression (12) expresses a relationship between the $angle_{ii'}$ of the line connecting pattern elements and $T_j$. In these expressions, the terms $B1_{ii'j}$, $B2_{ii'j}$, $B3_{ii'j}$, and $B4_{ii'j}$ are expressed by using binary variables $Z1_{ii'j}$, $Z2_{ii'j}$, and $Z3_{ii'j}$ in Expression (13) to Expression (17) and Expression (27). By using these expressions, the evaluation value in FIG. 6B may be calculated. For example, if Z1=1, Z2=Z3=0, B1=90, 0≤B2≤90, B3=B4=0. In this case, Expression (12) is $angle_{ii'}-T_j=B2_{ii'j}-90$. Expression (11) is:

$$A_{ii'j}+500(1-D_{ii'j}) \geq -\alpha^* pitch_{ii'}+b^*-(angle_{ii'}-T_j)+c$$

In other words, when Z1=1, Z2=Z3=0, an evaluation value in Interval B in FIG. 6B is acquired. The evaluation value $f=B1_{ii'j}-B2_{ii'j}+B3_{ii'j}-B4_{ii'j}$ is determined by $angle_{ii'}-T_j$. As the value increases, the difficulty of resolution of the pattern increases. Therefore, the evaluation value represents a resolution difficulty (exposure difficulty). In Interval A, it may be expressed $f=B1_{ii'j}$, $angle_{ii'}-T=B1_{ii'j}-180$. In Interval B, it may be expressed $f=90-B2_{ii'j}$. In Interval C, it may be $f=B3_{ii'j}$, $angle_{ii'}-T_j=B3_{ii'j}$. In Interval D, it may be expressed that $f=90-B4_{ii'j}$, $angle_{ii'}-T_j=90+B4_{ii'j}$.

From this, it may be understood that Expression (12) expresses a constraint condition that a broken-line type evaluation value f is described with a mixed integer programming problem. $B1_{ii'j}$, $Z1_{ii'j}$ and so on are parameters for allowing the description with a mixed integer programming problem.

Expression (18) expresses a constraint condition that the worst value of $A_{ii'j}$ is $A_j$. Expression (19) expresses a constraint condition that the term $A_{ii'j}$ composed on a distance and angle between pattern elements takes a value that is higher than 0. Expression (20) expresses a constraint condition that $T_j$ is equal to or higher than 0° and equal to or lower than 180°.

Having described the constraint conditions above, Expression (7), Expression (8), Expression (9), and Expression (11) are not required to describe for distances between all possible pattern elements. More specifically, for example, a distance equal to or longer than the order of k1=1.0 expressed in a resolution D=k1×λ/NA (λ: wavelength, NA: numerical aperture) may be excluded in advance based on a constraint condition to omit unnecessary calculations, which may reduce the calculation time required to acquire its solution.

Next, boundary conditions expressed by Expression (21) to Expression (23) will be described. Expression (21) expresses a boundary condition relating to color that the first color is always used. Expression (22) and Expression (23) express distance-related boundary conditions. Expression (22) expresses a boundary condition that a distance between pattern elements in each color takes a value higher than zero. Expression (23) expresses a boundary condition that a minimum value of a distance between all pattern elements to decompose takes a value higher than zero.

Finally, binary variables expressed by Expression (24) to Expression (27) will be described. The term $y_j$ in Expression (24) is a binary variable indicating whether to use the jth color or not. If it is used, 1 is input. If not, 0 is input. The $x_{ij}$ in Expression (25) is a binary variable indicating whether the jth color is to be used with a mask pattern number i. If it is used, 1 is input. If not, 0 is input. The term $D_{ii'j}$ in Expression (26) is a binary variable indicating whether both of the ith pattern and the i'th pattern are colored with the jth color or not. If both of them are colored, 1 is input. Otherwise, 0 is input. The terms $Z1_{ii'j}$, $Z2_{ii'j}$, and $Z3_{ii'j}$ in Expression (27) are binary variables to be used for describing an angle between pattern elements with a mixed integer programming problem, as described in the description of constraint conditions above. The combination of binary variables 0 and 1 allows description of an evaluation value in Interval A to Interval D in FIG. 6B.

The mixed integer programming problem is solved based on the Expressions above in step S109. Thus, the pattern to be decomposed in FIG. 3 may be divided into patterns for masks, and the number of masks and patterns of the masks may be determined.

Figure 7A:
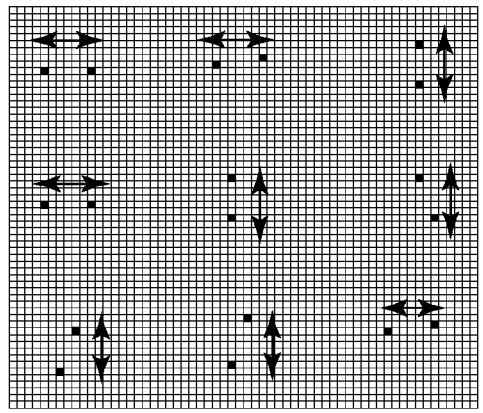
FIG. 7A illustrates a mask pattern decomposed by a conventional method.
Figure 7A:
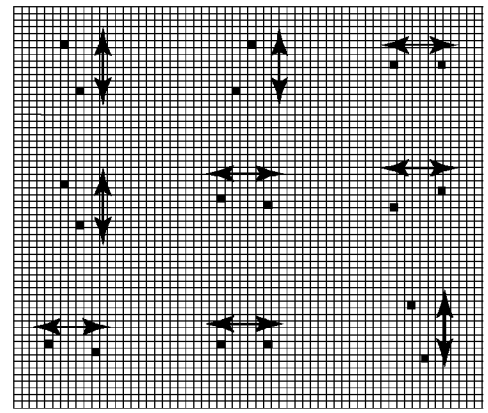
Figure 7B:
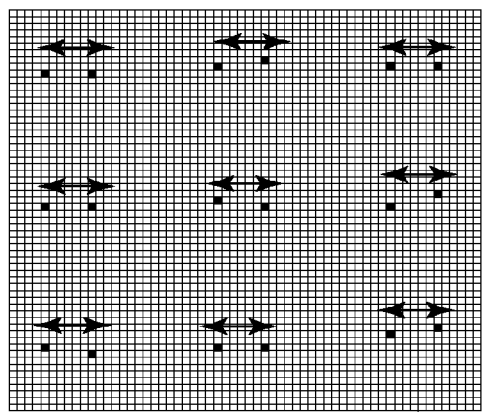
FIG. 7B illustrates a mask pattern decomposed according to the present invention.
Figure 7B:
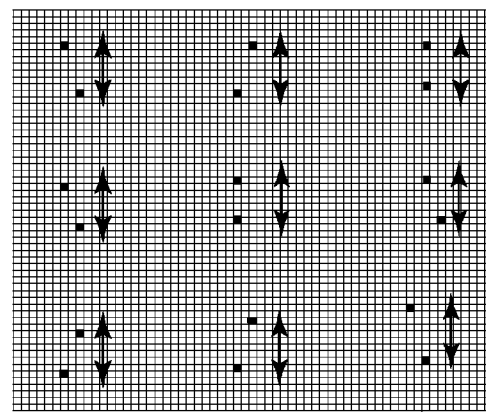

FIG. 7A illustrates patterns of masks acquired without applying the pattern determination method according to this embodiment. FIG. 7B illustrates patterns of masks acquired by applying the pattern determination method according to this embodiment. The notations, mask 1 (first mask) and mask 2 (second mask), refer to masks colored differently with a first color and a second color. The numbers 1 and 2 do not refer to their order. As shown on Table 2, a minimum distance between pattern elements in the mask 1 and mask 2 in FIG. 7A is equal to 138 nm. The same is true in FIG. 7B. On the other hand, FIG. 7A and FIG. 7B are different in arrangement of patterns. FIG. 7A and FIG. 7B illustrate arrows that indicate directions of arrangement of mask patterns. The mask patterns in FIG. 7A extend both in the vertical direction and the horizontal direction, and the directions of arrows of the mask 1 and mask 2 are both irregular. On the other hand, in the mask patterns in FIG. 7B, the directions of arrows of the mask 1 and mask 2 are regular. The arrows in the mask 1 align in the horizontal direction, and the arrows in the mask 2 align in the vertical direction. As illustrated on Table 2, in FIG. 7B applying the pattern determination method of this embodiment, $T_1$ of the mask 1 is acquired as 0 degrees, and $T_2$ of the mask 2 is acquired as 90 degrees.

TABLE 2

|  | MASK 1 | MASK 2 | MASK 1 | MASK 2 |
| --- | --- | --- | --- | --- |
| MINIMUM DISTANCE BETWEEN PATTERN ELEMENTS | 138 nm | 138 nm | 138 nm | 138 nm |
| $T_i$ |  |  | 0 deg | 90 deg |

Figure 8:
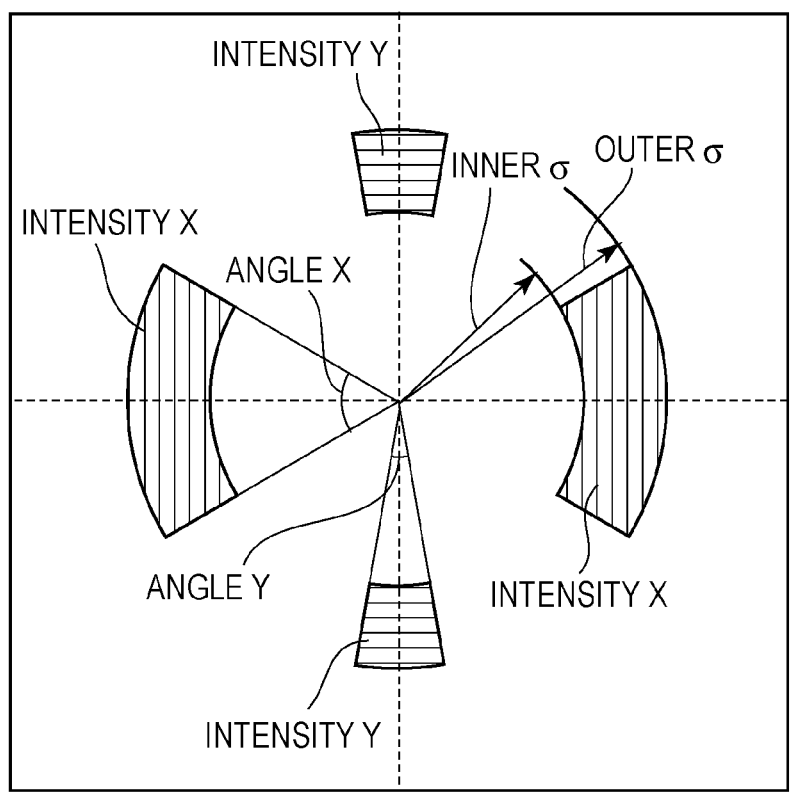
FIG. 8 illustrates parameters of an effective light source distribution.

The number of masks and patterns of masks are acquired above. Next, in order to examine effects of this embodiment with respect to resolving performance, the mask patterns are used to simultaneously optimize an effective light source distribution and the mask patterns. The simultaneous optimization is performed with a tangential polarization with a wavelength of 193.368 nm and a numerical aperture of 1.0 by simultaneously changing parameters of an I-Quad illumination and dimensions of mask patterns. In this case, an attenuated phase shift mask is used as a material of the masks. The parameters of the effective light source distribution to be changed for the simultaneous optimization may include an outer sigma, an inner sigma, angles and light intensities, as illustrated in FIG. 8. One reason for use of an I-Quad illumination is easy identification of a difference in light intensity between poles disposed in a direction contributing to easy resolution and poles disposed in a direction contributing relatively difficult resolution in a sum of two types of dipole illumination. Another reason is that a pattern of a mask may have a mixture of a tight (small) pitch part and a loose (large) pitch part, that is, a mixture of a critical mask pattern and a non-critical mask pattern. For fair comparison of optimization results, the simultaneous optimization was performed by setting a same range of changes of parameters for patterns of masks. The pattern elements were evaluated in the x-direction and y-direction.

Figure 9A:
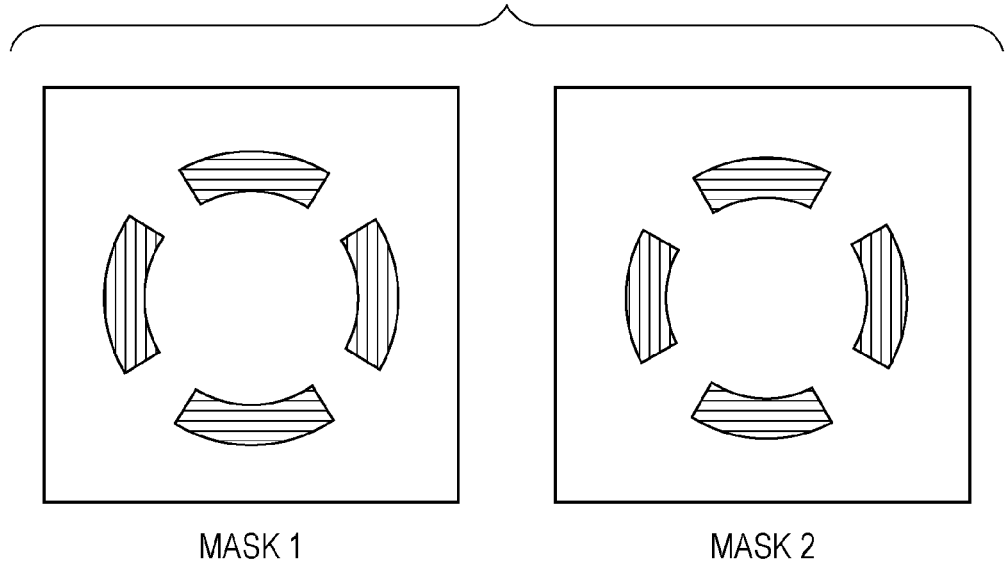
FIG. 9A illustrates an effective light source distribution optimized by a conventional method.
Figure 9B:
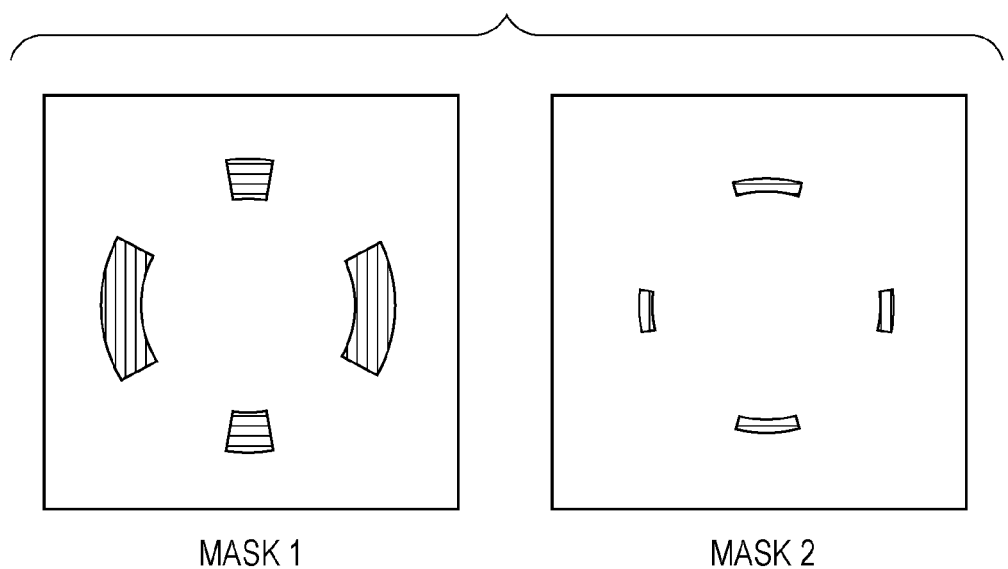
FIG. 9B illustrates an effective light source distribution optimized according to the present invention.

FIGS. 9A and 9B illustrate the optimization results. FIGS. 9A and 9B illustrate effective light source distributions resulting from optimizations corresponding to the mask patterns illustrated in FIGS. 7A and 7B, respectively. Table 3 shows numerical values for comparison.

TABLE 3

|  | MASK 1 | MASK 2 | MASK 1 | MASK 2 |
| --- | --- | --- | --- | --- |
| OUTER σ | 0.704 | 0.667 | 0.705 | 0.627 |
| INNER σ | 0.517 | 0.490 | 0.491 | 0.555 |
| INTENSITY X | 1 | 1 | 1 | 0.582 |
| ANGLE X | 60.6 deg | 60.3 deg | 52.0 deg | 23.6 deg |
| INTENSITY Y | 0.786 | 0.733 | 0.582 | 1 |
| ANGLE Y | 59.1 deg | 59.9 deg | 20.8 deg | 31.3 deg |
| CDDOF(5%)min | 38.3 nm | | 39.2 nm | |
| NILSmin | 1.74 | | 2.14 | |

The CDDOF (5%) min and NILSmin in Table 3 are worst values of a depth of focus and contrast, respectively, that satisfy a dimension within 5% of the target dimension 43 nm among a plurality of evaluation points. The higher the depth of focus and the contrast are, the better the lithography characteristic (resolving performance) is. Comparing these numerical values on Table 3, both of CDDOF (5%) min and NILSmin to which the pattern determination method of this embodiment is applied have better values. From this, it may be understood that application of the pattern determination method of this embodiment allows determination of lithography-friendly patterns of masks.

Next, there will be described the functionality of not only determination of the number of masks and patterns of the masks but also determination of an effective light source distribution that illuminates masks according to the pattern determination method of this embodiment. With focus on the values of the intensity X and intensity Y to which the pattern determination method of this embodiment is applied on Table 3, it may be understood that the intensity X is higher on the mask 1 while the intensity Y is higher on the mask 2. The higher intensity X on the mask 1 is caused by easy resolution of pattern elements disposed in the x-direction because the pattern of the mask 1 has a tight pitch in the horizontal direction (x-direction) as illustrated in FIG. 7B. Also, the higher intensity Y on the mask 2 is caused by easy resolution of pattern elements disposed in the y-direction because the pattern of the mask 2 has a tight pitch in the vertical direction (y-direction). On the other hand, the angles $T_1$ and $T_2$ resulting from the acquisition of a mask pattern are equal to 0 degrees and 90 degrees, respectively, which are matched with the direction of the components having a higher intensity in the optimization result of a pattern of a mask. Thus, from the angles $T_1$ and $T_2$, information on the angle directions of poles of an effective light source distribution may be acquired that is important for resolving a pattern of a mask. The information may be used to determine an effective light source distribution.

Based on the facts above, not only the number of masks and patterns of masks may be determined but also an effective light source distribution for resolving a critical mask pattern may be determined.

Having described according to this embodiment that mixed integer programming is used with Expressions (1) and (2) as cost functions, an embodiment of the present invention is not limited thereto. Other cost functions and other optimization methods may be used as far as the cost function includes a term representing the number of masks and a term defined by the distance and angle between pattern elements in a mask. For example, genetic algorithm may be used as an alternative optimization method. The optimization method may include assigning a plurality of pattern elements to masks and coloring the patterns differently by repeatedly changing the decomposition for decomposing patterns of masks or may include coloring patterns by one operation under a predetermined rule.

In Expression (1), the cost function may only include a term representing the number of masks and a term defined by the distance and angle between pattern elements in a mask, excluding a term representing a minimum value of a distance between pattern elements.

Having described an embodiment of the present invention, the present invention should not be limited to the embodiment, but various modifications and changes could be made without departing from the spirit and scope of the invention.

A mask drawing apparatus may form a pattern on mask blanks by using data on a mask pattern determined by the mask pattern determination method of this embodiment to produce a mask. The produced mask may be used for exposure by an exposure apparatus.

Embodiments of the present invention can also be realized by a computer of a system or apparatus that reads out and executes computer executable instructions recorded on a storage medium (e.g., non-transitory computer-readable storage medium) to perform the functions of one or more of the above-described embodiment(s) of the present invention, and by a method performed by the computer of the system or apparatus by, for example, reading out and executing the computer executable instructions from the storage medium to perform the functions of one or more of the above-described embodiment(s). The computer may comprise one or more of a central processing unit (CPU), micro processing unit (MPU), or other circuitry, and may include a network of separate computers or separate computer processors. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

According to an embodiment of the present invention, a mask pattern may be determined that is easy to resolve when a pattern is decomposed into a plurality of mask patterns.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-033509, filed Feb. 22, 2013, which is hereby incorporated by reference herein in its entirety.

What is claimed is:

1. A method for determining patterns for a plurality of masks used for a mask manufacturing method for manufacturing the plurality of masks, the method being executed by a processor, comprising:

acquiring data on a pattern containing a plurality of pattern elements; and assigning the acquired plurality of pattern elements into masks, decomposing the acquired plurality of pattern elements into patterns of the masks, and calculating an evaluation value for an evaluation index, based on a number of masks, the distances between a plurality of pattern elements in each mask, and angles of lines connecting a plurality of pattern elements in each mask, wherein the evaluation index has a term defined by difference between the angles and a first predetermined angle in one mask illuminated by a first illumination and a term defined by difference between the angles and a second predetermined angle in other mask illuminated by a second illumination different from the first illumination, wherein the first predetermined angle is different from the second predetermined angle, wherein a pattern of each mask is determined based on the calculated evaluation value, and wherein the mask manufacturing method comprises a step of manufacturing the plurality of masks, each mask including the determined pattern.

2. The method according to claim 1, wherein the term has an evaluation value of the evaluation index which gets worse than the evaluation at 0 degree as the differences between angles of lines connecting a plurality of pattern elements in a mask and the predetermined angles increases from 0 degrees and approaches 90 degrees.

3. The method according to claim 1, wherein the evaluation index further contains a term defined by a minimum distance between a plurality of pattern elements.

4. The method according to claim 1, wherein a pattern of each mask is determined with mixed integer programming by defining the evaluation index as a cost function and defining a constraint condition for a distance between a plurality of pattern elements in each mask and angles of lines connecting a plurality of pattern elements as a mixed integer programming problem.

5. The method according to claim 1, wherein an evaluation value of the evaluation index is calculated for evaluation of a plurality of pattern elements the distances between which fall within a predetermined range.

6. The method according to claim 1, wherein the plurality of pattern elements are a pattern for cutting a line pattern formed on a substrate.

7. The method according to claim 1, wherein the determined mask patterns are a first mask pattern containing a plurality of pattern elements aligned longitudinally and a second mask pattern containing a plurality of pattern elements aligned transversely.

8. The method according to claim 1, further comprising determining a light intensity distribution formed on a pupil plane of an illumination optical system that illuminates each of the determined mask patterns.

9. The method according to claim 1, wherein an evaluation value of the evaluation index is calculated by repeatedly changing a decomposition for assigning the acquired plurality of pattern elements into masks and decomposing the acquired plurality of pattern elements into patterns of the masks, and a pattern for each mask is determined based on the evaluation value calculated by repeatedly changing the decomposition.

10. A non-transitory recording medium that stores a program causing an information processing apparatus to execute the method according to claim 1.

11. The method according to claim 1, wherein the first illumination is a dipole illumination having two poles disposed in a direction of the first predetermined angle, and wherein the second illumination is a dipole illumination having two poles disposed in a direction of the second predetermined angle.

12. A mask manufacturing method for manufacturing a plurality of masks, comprising:

determining patterns for a plurality of masks using the method according to claim 1, and manufacturing the plurality of masks, each mask including the determined pattern.

13. An information processing apparatus which determines patterns for a plurality of masks used for a mask manufacturing method for manufacturing the plurality of masks, the apparatus comprising a processing unit configured to acquire data on a pattern containing a plurality of pattern elements, assign the acquired plurality of pattern elements into masks, decompose the acquired plurality of pattern elements into patterns of the masks, and calculate an evaluation value for an evaluation index, based on a number of masks, the distances between a plurality of pattern elements in each mask, and angles of lines connecting a plurality of pattern elements in each mask, wherein the evaluation index has a term defined by difference between the angles and a first predetermined angle in one mask illuminated by a first illumination and a term defined by difference between the angles and a second predetermined angle in other mask illuminated by a second illumination different from the first illumination, wherein the first predetermined angle is different from the second predetermined angle, wherein the processing unit determines a pattern of each mask based on the calculated evaluation value, and wherein the mask manufacturing method comprises a step of manufacturing the plurality of masks, each mask including the determined pattern.

* * * * *